(12) United States Patent
Lin

(10) Patent No.: US 11,264,993 B1
(45) Date of Patent: Mar. 1, 2022

(54) COUNTING DEVICE

(71) Applicant: Winbond Electronics Corp., Taichung (TW)

(72) Inventor: Che-Min Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/322,908

(22) Filed: May 18, 2021

(51) Int. Cl.
*H03K 23/00* (2006.01)
*H03K 23/40* (2006.01)
*H03K 23/42* (2006.01)
*H03K 23/50* (2006.01)
*H03K 19/20* (2006.01)

(52) U.S. Cl.
CPC .............. *H03K 23/40* (2013.01); *H03K 23/42* (2013.01); *H03K 23/425* (2013.01); *H03K 23/50* (2013.01); *H03K 19/20* (2013.01)

(58) Field of Classification Search
None
See application file for complete search history.

(56) References Cited

U.S. PATENT DOCUMENTS

| 2004/0252751 | A1 | 12/2004 | Ogasawara | |
| 2010/0201409 | A1* | 8/2010 | Terada | H03K 23/667 327/117 |
| 2011/0089987 | A1* | 4/2011 | Yang | H03K 23/425 327/295 |
| 2016/0226495 | A1* | 8/2016 | Fujisawa | H03K 23/40 |
| 2020/0382124 | A1* | 12/2020 | Choi | H03K 23/40 |

* cited by examiner

*Primary Examiner* — Tuan T Lam
(74) *Attorney, Agent, or Firm* — JCIPRNET

(57) ABSTRACT

A counting device, including multiple counting circuit stages and a first logic operation circuit, is provided. The counting circuit stages are serially coupled in sequence. A first counting circuit stage performs a counting action according to a first clock signal and generates a first counting result. Second to Nth counting circuit stages perform counting actions according to a second clock signal, where N is a positive integer greater than 2. The first logic operation circuit provides the first counting result to be the second clock signal according to an indication signal.

10 Claims, 7 Drawing Sheets

COUNTING DEVICE

BACKGROUND

Technical Field

The disclosure relates to a counting device, and particularly relates to a counting device that can improve the working speed.

Description of Related Art

In the application of a counting device, an initial value may be set for the counting device. Then, in a counting action, the counting device may act according to a clock signal and output a counting result with multiple bits.

In the prior art, when the counting device is operating, a calculation target value may be set as a counting termination point. In addition, a logic operation circuit in the counting device is activated. When the clock signal is oscillating, the logic operation circuit performs operations on the gradually decreasing counting results, and when the counting result reaches the calculation target value, the logic operation circuit may output a counting termination signal. In such application, when the frequency of the clock signal is too high (the period is too small) such that the calculation speed of the logic operation circuit is too slow to generate the counting termination signal on time, the counting action of the counting device will cause an error.

SUMMARY

The disclosure provides a counting device, which can effectively improve the working frequency.

The counting device of the disclosure includes multiple counting circuit stages and a first logic operation circuit. The counting circuit stages are serially coupled in sequence. A first counting circuit stage performs a counting action according to a first clock signal and generates a first counting result. Second to Nth counting circuit stages performs counting actions according to a second clock signal, where N is a positive integer greater than 2. The first logic operation circuit is coupled to the counting circuit stages and provides the first counting result to be the second clock signal according to the indication signal.

Based on the above, the disclosure enables the first counting circuit stage to work according to the relatively high frequency first clock signal, and enables the frequency of the first clock signal to be reduced to generate the second clock signal, and then enables the subsequent second counting circuit stage to Nth counting circuit stage to work according to the relatively low frequency second clock signal. In this way, the counting device according to the embodiments of the disclosure may generate the counting result performed by the first clock signal, and will not cause an error due to the action of the operation circuit being too late, which effectively improves the speed of the counting device.

DETAILED DESCRIPTION OF DISCLOSED EMBODIMENTS

Figure 1:
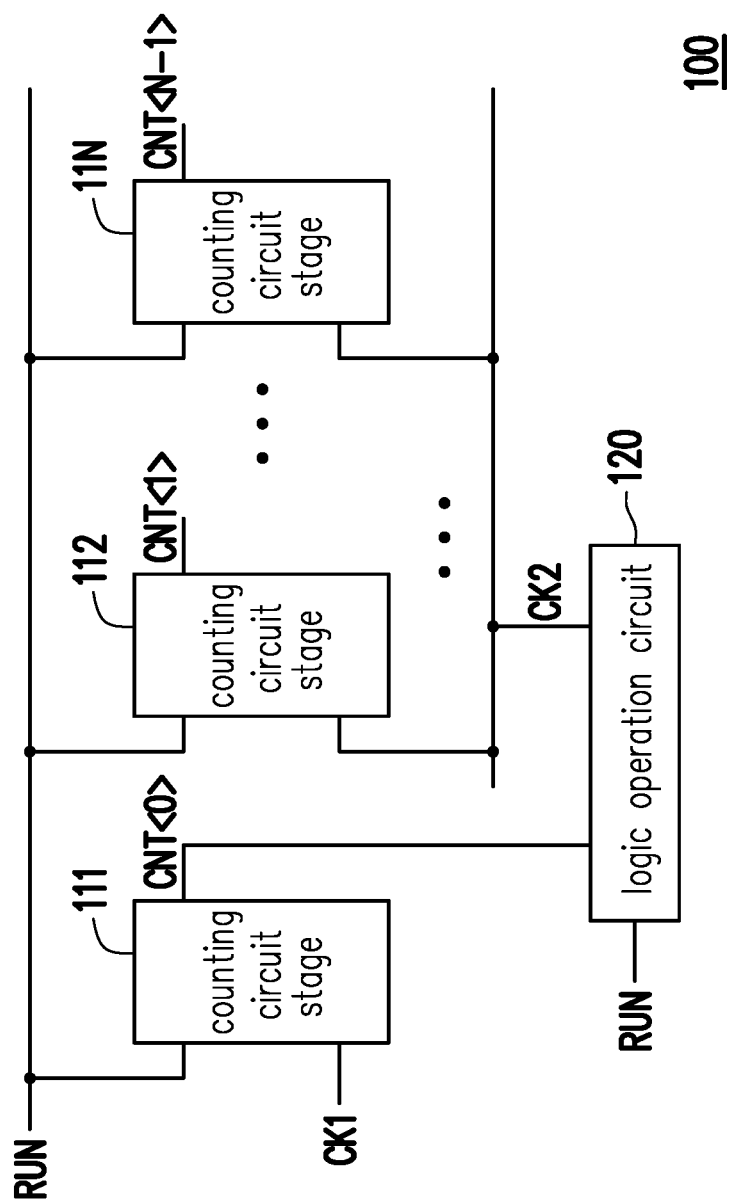
FIG. 1 is a schematic diagram of a counting device according to an embodiment of the disclosure.

Please refer to FIG. 1. FIG. 1 is a schematic diagram of a counting device according to an embodiment of the disclosure. A counting device 100 includes multiple counting circuit stages 111 to 11N and a logic operation circuit 120. The counting circuit stages 111 to 11N are serially coupled in sequence. The first counting circuit stage 111 receives a first clock signal CK1, and performs a counting action according to the first clock signal CK1 to generate a first counting result CNT<0>. The logic operation circuit 120 is coupled to the counting circuit stages 111 to 11N. The first counting circuit stage 111 sends the generated first counting result CNT<0> to the logic operation circuit 120. The logic operation circuit 120 provides the first counting result CNT<0> to generate a second clock signal CK2 according to the first counting result CNT<0> and an indication signal RUN.

In the counting circuit stages 111 to 11N, the second counting circuit stage 112 to the Nth counting circuit stage 11N all receive the second clock signal CK2. The second counting circuit stage 112 to the Nth counting circuit stage 11N performs counting actions according to the second clock signal CK2, and respectively generate second counting result to Nth counting result CNT<1> to CNT<N−1>. The frequency of the second clock signal CK2 is lower than the frequency of the first clock signal CK1.

In this embodiment, the logic operation circuit 120 may determine whether the second clock signal CK2 is equal to the first counting result CNT<0> or the first clock signal CK1 according to the first counting result CNT<0> and the indication signal RUN. When the indication signal RUN is at a first logic level, the logic operation circuit 120 may provide the first counting result CNT<0> to be the second clock signal CK2. In contrast, when the indication signal RUN is at a second logic level, the logic operation circuit 120 may provide the first clock signal CK1 to be the second clock signal CK2. In addition, the counting circuit stages 111 to 11N also receive the indication signal RUN, and are activated to perform accelerated counting actions when the indication signal RUN is at the first logic level. In this embodiment, the first logic level may be logic 1 or logic 0, and the second logic level may be logic 0 or logic 1.

In this embodiment, the counting circuit stages 111 to 11N may be constructed as a synchronous counter. The counting circuit stages 111 to 11N may respectively receive multiple initial values at an initial time point. The initial values are used to set a counting starting point of the counting device 100. The counting circuit stages 111 to 11N performs a decremental counting action from the counting starting point in the counting action. The counting actions of the counting circuit stages 111 to 11N may end when the first counting result to the Nth counting result CNT<0> to CNT<N−1> equal to a preset value.

It is worth noting that in this embodiment, only the first counting circuit stage 111 corresponding to the least significant bit in the counting circuit stages 111 to 11N performs the counting action according to the relatively high frequency first clock signal CK1. The counting actions of the remaining second counting circuit stage 112 to Nth counting circuit stage 11N are all performed according to the relatively low frequency second clock signal CK2. Therefore, since the frequency of the clock signal used as the basis for counting is too high, the error caused by the operation of a peripheral operation circuit being too late may be effectively avoided. Therefore, the counting device 100 can effectively improve the speed of the counting actions under the premise of generating the correct counting results CNT<0> to CNT<N−1>.

Figure 2:
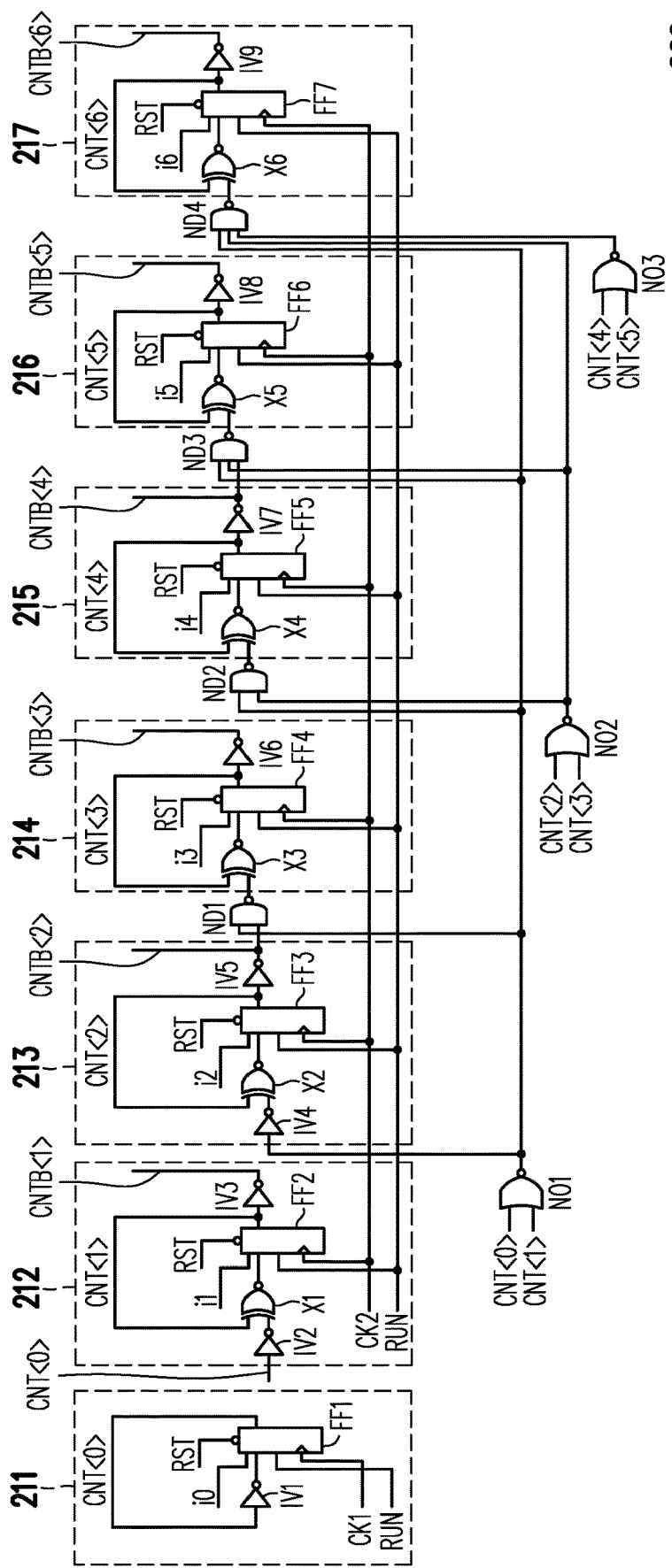
FIG. 2 is a schematic circuit diagram of multiple counting circuit stages of a counting device according to an embodiment of the disclosure.
Figure 3:
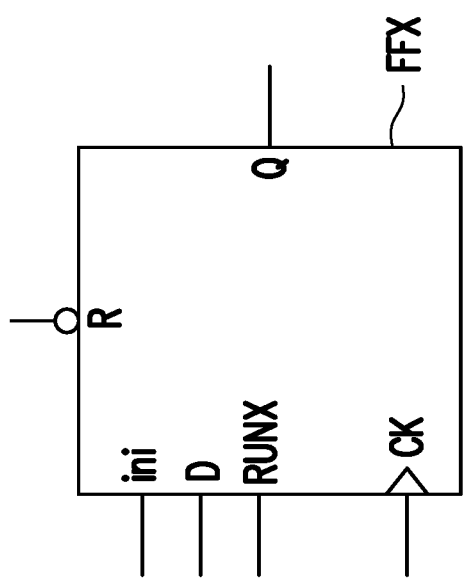
FIG. 3 is a reference numeral diagram of a flip flop in a counting circuit stage according to an embodiment of the disclosure.

Please refer to FIG. 2 and FIG. 3. FIG. 2 is a schematic circuit diagram of multiple counting circuit stages of a counting device according to an embodiment of the disclosure. FIG. 3 is a reference numeral diagram of a flip flop in a counting circuit stage according to an embodiment of the disclosure. In FIG. 2, a counting device 200 includes counting circuit stages 211 to 217. The first counting circuit stage 211 receives a first clock signal CK1 and performs a counting action according to the first clock signal CK1. In this embodiment, the first counting circuit stage 211 includes a flip flop FF1 and an inverter IV1. Please refer to FIG. 3 first. The reference numerals of flip flop FF1 to FF7 in the embodiment of FIG. 2 may be referred to a flip flop FFx as shown in FIG. 3. The flip flop FFx has a clock end CK, a reset end R, an initial end ini, an indication signal receiving end RUNX, a data end D, and an output end Q. The flip flop FFx may receive a work clock through the clock end CK, receive an initial value for initialization through the initial end ini, receive an indication signal RUN through the indication signal receiving end RUNX, receive a reset signal through the reset end R, and generate a counting result through the output end Q.

Please refer to FIG. 2 again. In the first counting circuit stage 211, the initial end of the flip flop FF1 receives an initial value i0, the clock end of the flip flop FF1 receives the first clock signal CK1, the indication signal receiving end of the flip flop FF1 receives the indication signal RUN, the data end of the flip flop FF1 is coupled to an output end of the inverter IV1, and the output end of the flip flop FF1 generates a first counting result CNT<0>. In this embodiment, the flip flop FF1 may be constructed as a frequency divider and is used to divide the frequency of the first clock signal CK1 by 2 to generate the first counting result CNT<0>.

In addition, the second counting circuit stage 212 includes the flip flop FF2, an XNOR gate X1, and inverters IV2 and IV3. The XNOR gate X1 has a first input end to receive a second counting result CNT<1>, and a second input end to receive a logic operation result generated according to the previous-stage counting result. In the second counting circuit stage 212, the second input end of the XNOR gate X1 receives an inverse signal of the first counting result CNT<0> generated by the inverter IV2. An output end of the XNOR gate X1 is coupled to the data end of the flip flop FF2.

In addition, the initial end of the flip flop FF2 receives an initial value i1, the clock end of the flip flop FF2 receives a second clock signal CK2, the indication signal receiving end of the flip flop FF2 receives the indication signal RUN, the output end of the flip flop FF2 generates the second counting result CNT<1>. In addition, the inverter IV3 is coupled to the output end of the flip flop FF2 to generate a second reverse counting result CNTB<1>.

In this embodiment, the third counting circuit stage 213 includes a flip flop FF3, an XNOR gate X2, and inverters IV4 and IV5. The XNOR gate X2 has a first input end to receive the third counting result CNT<2>, and a second input end to receive a logic operation result generated according to the previous-stage counting result. In the third counting circuit stage 213, the second input end of the XNOR gate X2 receives OR operation results of the first counting result CNT<0> and the second counting result CNT<1> generated by the inverter IV4 and a NOR gate NO1. The output end of the XNOR gate X2 is coupled to the data end of the flip flop FF3.

In addition, the initial end of the flip flop FF3 receives an initial value i2, the clock end of the flip flop FF3 receives the second clock signal CK2, the indication signal receiving end of the flip flop FF3 receives the indication signal RUN, and the output end of the flip flop FF3 generates a third counting result CNT<2>. The inverter IV5 is coupled to the output end of the flip flop FF3 to generate a second reverse counting result CNTB<2>.

The circuit structures of the fourth counting circuit stage 214 to the seventh counting circuit stage 217 are similar to that of the third counting circuit stage 213, and the relevant details will not be repeated. The fourth counting circuit stage 214 to the seventh counting circuit stage 217 respectively include flip flops FF4 to FF7, XNOR gates X3 to X6, and inverters IV6 to IV9. In addition, the XNOR gate X3 receives a logic operation result of multiple previous-stage counting results (the first counting result CNT<0> to the third counting result CNT<2>) through a NAND gate ND1 and the NOR gate NO1. The XNOR gate X4 receives a logic operation result of multiple previous-stage counting results (the first counting result CNT<0> to a fourth counting result CNT<3>) through a NAND gate ND2, a NOR gate NO2, and the NOR gate NO1. The XNOR gate X5 receives a logic operation result of multiple previous-stage counting results (the first counting result CNT<0> to a fifth counting result CNT<4>) through a NAND gate ND3, the NOR gate NO1, and the NOR gate NO2. The XNOR gate X6 receives a logic operation result of multiple previous-stage counting results (the first counting result CNT<0> to a sixth counting result CNT<5>) through a NAND gate ND4, and NOR gates NO1, NO2, and NO3.

Incidentally, the inverters IV6 to IV9 respectively generate a fourth reverse counting result CNTB<3> to a seventh reverse counting result CNTB<6>. The flip flops FF4 to FF7 respectively performs initialization actions according to initial values i3 to i6.

In this embodiment, the flip flops FF1 to FF7 may be J-K flip flops.

The counting circuit stages 211 to 217 may performs a synchronous counting action, and obtain counting starting points respectively according to the initial values i0 to i6 at the initial time point. The flip flop FF1 and the flip flops FF2 to FF7 performs decremental counting actions respectively according to the first clock signal CK1 and the second clock signal CK2 starting from the counting start points.

Figure 4:
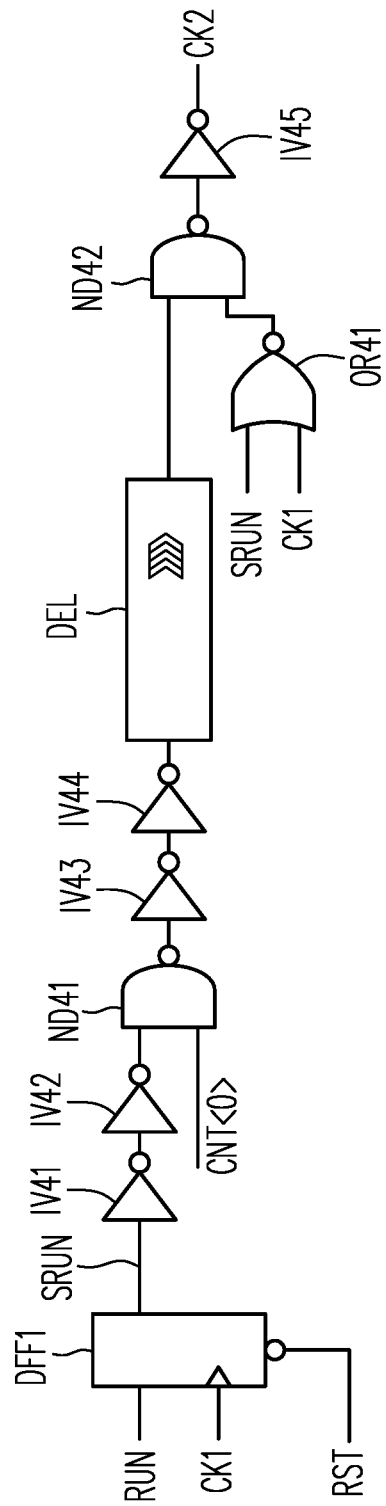
FIG. 4 is a schematic diagram of a logic operation circuit of a counting device according to an embodiment of the disclosure.

Please refer to FIG. 4 below. FIG. 4 is a schematic diagram of a logic operation circuit of a counting device according to an embodiment of the disclosure. A logic operation circuit 400 is used to provide a second clock signal CK2 according to an instruction signal RUN. The logic operation circuit 400 includes a flip flop DFF1, inverters IV41 to IV45, NAND gates ND41 and ND42, an OR gate OR41, and a delayer DEL. The flip flop DFF1 is a D flip flop, which receives the indication signal RUN, synchronizes the indication signal RUN according to a first clock signal CK1, and generates a synchronization indication signal SRUN. In addition, the flip flop DFF1 may performs a reset action according to a reset signal RST. The inverters IV41 and IV42 are serially connected in sequence between the output end of the flip flop DFF1 and an input end of the NAND gate ND41. Another input end of the NAND gate ND41 receives a first counting result CNT<0>. The NAND gate ND41 performs a NAND operation on the synchronization indication signal SRUN and the first counting result CNT<0>, and sends the result to the NAND gate ND42 through the serially connected inverters IV43 and IV44 and delayer DEL. Specifically, when the synchronization indication signal SRUN is at a logic level 1, the first counting result CNT<0> may be sent to an input end of the NAND gate ND42 after being delayed. In contrast, when the synchronization indication signal SRUN is at a logic level 0, the delayer DEL sends the logic level 1 to the NAND gate ND42.

On the other hand, the OR gate OR41 receives the first clock signal CK1 and the synchronization indication signal SRUN. When the synchronization indication signal SRUN is at the logic level 1, the first clock signal CK1 may be masked and not sent to the NAND gate ND42. In contrast, when the synchronization indication signal SRUN is at the logic level 0, the first clock signal CK1 may be sent to the NAND gate ND42.

Continuing the above description, when the synchronization indication signal SRUN is at the logic level 1, the NAND gate ND42 may output an inverse signal of the first counting result CNT<0>, and the second clock signal CK2 may be substantially the same as the first counting result CNT<0> through the inverter IV45. In contrast, when the synchronization indication signal SRUN is at the logic level 0, the NAND gate ND42 outputs an inverse signal of the first clock signal CK1, and the second clock signal CK2 may be substantially the same as the first clock signal through the inverter IV45.

Figure 5:
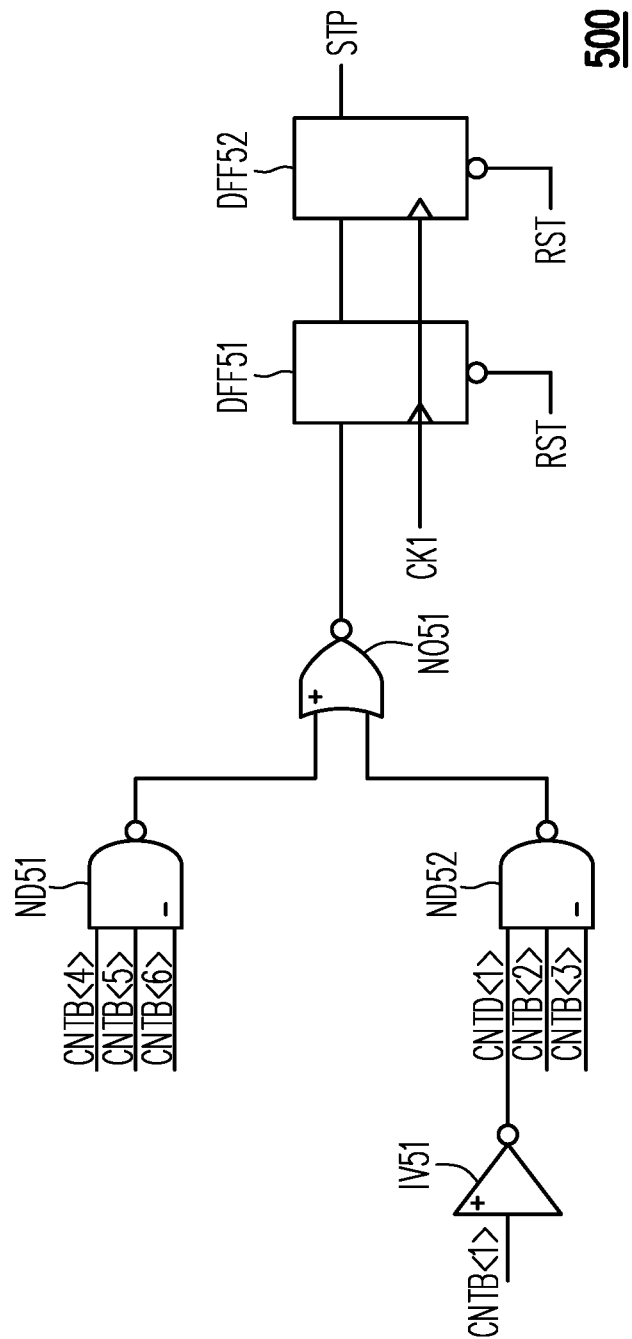
FIG. 5 is a schematic circuit diagram of a logic operation circuit for generating a counting termination signal in a counting device according to an embodiment of the disclosure.

Please refer to FIG. 5 below. FIG. 5 is a schematic circuit diagram of a logic operation circuit for generating a counting termination signal in a counting device according to an embodiment of the disclosure. In an embodiment of the disclosure, the counting device may be configured with a logic operation circuit 500 to generate a counting termination signal STP. The counting termination signal STP is used to indicate that the counting action of the counting device is completed. An application circuit after the counting device may performs various required operations according to the counting termination signal.

Corresponding to the counting device 200 in the embodiment of FIG. 2, in this embodiment, a counting termination point of the counting device 200 is, for example, configured when a second counting result CNT<1> to a seventh counting result CNT<6> are respectively logic levels 1, 0, 0, 0, 0, and 0. The logic operation circuit 500 includes an inverter IV51, NAND gates ND51 and ND52, a NOR gate NO51, and flip flops DFF51 and DFF52. The inverter IV51, the NAND gates ND51 and ND52, and the NOR gate NO51 are used to perform logic operations based on a second inverse counting result CNTB<1> to a seventh inverse counting result CNTB<6>. When the second counting result CNT<1> to the seventh counting result CNT<6> are respectively at the logic levels 1, 0, 0, 0, 0, and 0, the NOR gate NO51 generates an output signal at the logic level 1. The output signal at the logic level 1 may be synchronized according to the first clock signal CK1 through the flip flops DFF51 and DFF52 to generate the counting termination signal STP. In addition, the flip flops DFF51 and DFF52 may performs reset actions according to a reset signal RST.

It is worth mentioning that in this embodiment, the designer may set the required counting termination point by himself, and change the inverter IV51, the NAND gates ND51 and ND52, and the NOR gate NO51 according to the logic expression required for the set counting termination point. The relevant logic expressions and the corresponding logic gate setting manners are well known to persons skilled in the art, which will not be repeated.

Figure 6A:
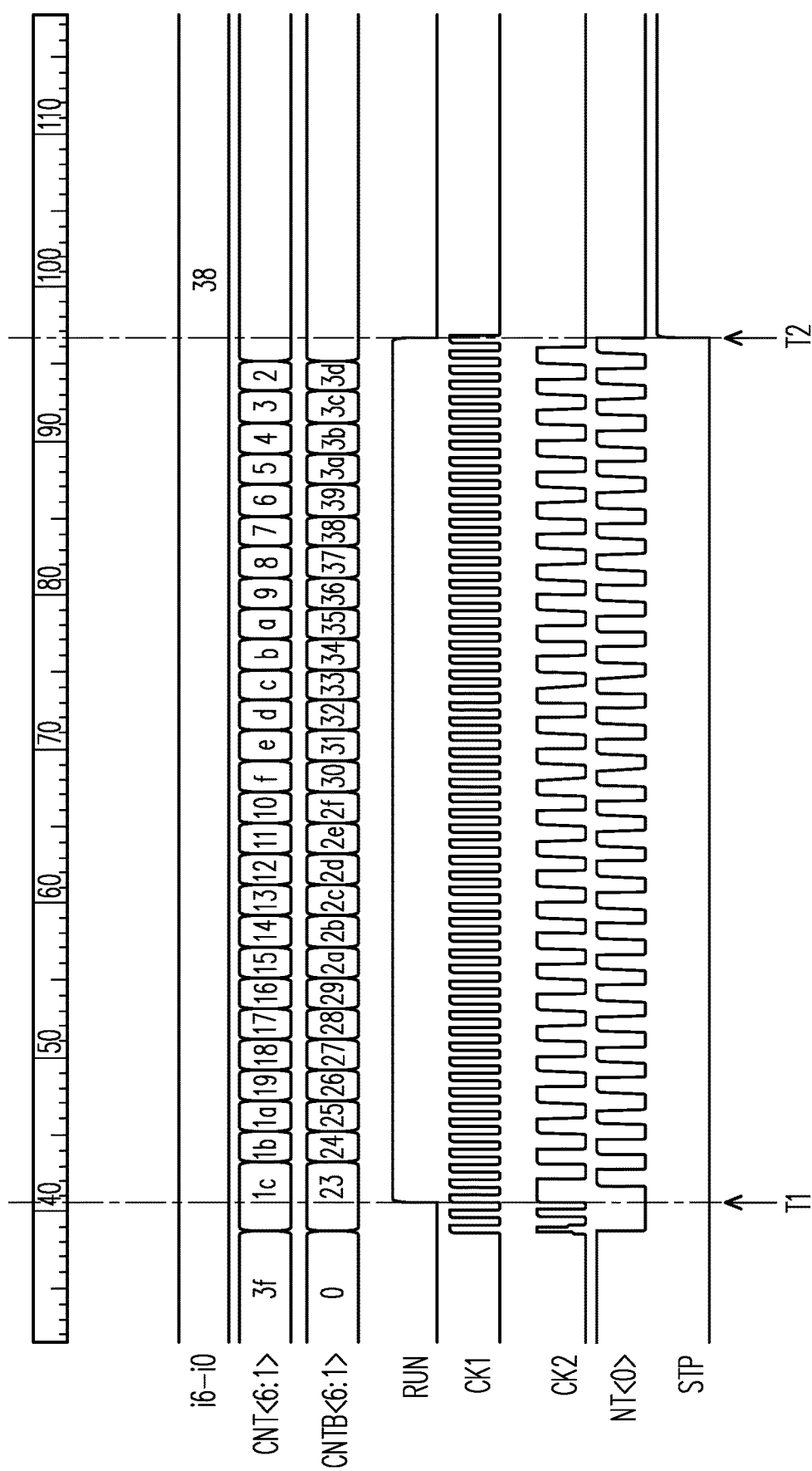
FIG. 6A and FIG. 6B are respectively waveform diagrams of counting actions performed by a counting device according to different initial values according to an embodiment of the disclosure.
Figure 6B:
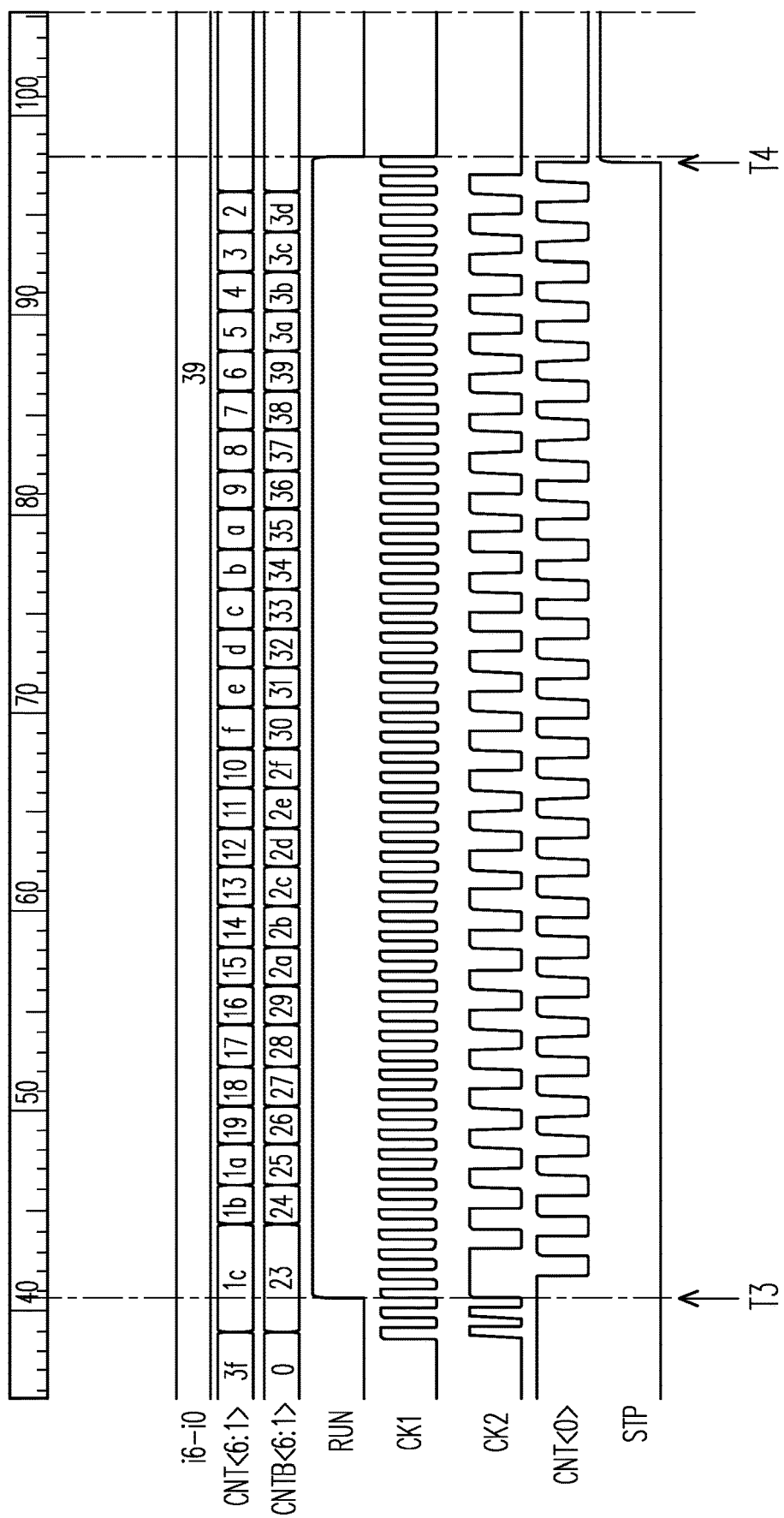

Please refer to FIG. 6A and FIG. 6B. FIG. 6A and FIG. 6B are respectively waveform diagrams of counting actions performed by a counting device according to different initial values according to an embodiment of the disclosure. In FIG. 6A, corresponding to the counting device 200 in the embodiment of FIG. 2, the counting device 200 receives an initial value i6-i0 with a hexadecimal value of 38 as a counting starting point, and activates a counting action at a time point T1. At the time point T1, the hexadecimal value of a seventh counting result CNT<6> to a second counting result CNT<1> is 1c, the hexadecimal value of a seventh reverse counting result CNTB<6> to a second reverse counting result CNTB<1> is 23, and a first counting result CNT<0> is at a logic level 0 at this time.

After the time point T1, the first counting result CNT<0> transitions according to a first clock signal CK1, and the second counting result CNT<1> to the seventh counting result CNT<6> transition according to the first counting result CNT<0>. Digit values of the first counting result CNT<0> to the seventh counting result CNT<6> may be decremented in sequence with the first clock signal CK1. At a time point T2, the first counting result CNT<0> to the seventh counting result CNT<6> are equal to a set termination time point. Therefore, a counting termination signal STP is pulled up to a logic level 1, and the counting action of the counting device 200 may be stopped.

In FIG. 6B, also corresponding to the counting device 200 in the embodiment of FIG. 2, the counting device 200 receives the initial value i6-i0 with a hexadecimal value of 39 as the counting starting point, and activates the counting action at a time point T3. At the time point T3, the hexadecimal value of the seventh counting result CNT<6> to the second counting result CNT<1> is 1c, the hexadecimal value of the seventh reverse counting result CNTB<6> to the second reverse counting result CNTB<1> is 23, and the first counting result CNT<0> is at the logic level 1 at this time.

After the time point T3, the first counting result CNT<0> transitions according to the first clock signal CK1, and the second counting result CNT<1> to the seventh counting result CNT<6> transition according to the first counting result CNT<0>. The digit values of the first counting result CNT<0> to the seventh counting result CNT<6> may be decremented in sequence with the first clock signal CK1. At a time point T4, the first counting result CNT<0> to the seventh counting result CNT<6> are equal to the set termination time point. Therefore, the counting termination signal STP is pulled up to the logic level 1, and the counting action of the counting device 200 may be stopped.

It can be seen from the waveforms of FIG. 6A and FIG. 6B that the counting device according to the embodiments of the disclosure may complete the counting action under the relatively high speed first time signal CK1, and will not cause an error due to the operation of the logic operation circuit being too late.

It is worth mentioning that in the waveforms of FIG. 6A and FIG. 6B, the counting device performs a decremental counting action. However, the scope of implementation of the disclosure does not limit that the counting device must performs the decremental counting action. According to the revelation of the embodiments and the implementation manners of the disclosure, it is not difficult for persons skilled in the art to perform the counting device performing an incremental counting action with the same concept.

In summary, the disclosure enables the first counting circuit stage to work according to the relatively high frequency first clock signal and maintains the normal counting behavior of the counting device. The disclosure enables the frequency of the first clock signal to be reduced to generate the second clock signal, and then enables the subsequent second counting circuit stage to Nth counting circuit stage to work according to the relatively low frequency second clock signal. In this way, the counting device according to the embodiments of the disclosure will not cause an error due to the action of the operation circuit being too late, which effectively improves the speed of the counting device.

What is claimed is:

1. A counting device, comprising:
   a plurality of counting circuit stages, serially coupled in sequence, wherein a first counting circuit stage performs a counting action according to a first clock signal and generates a first counting result, and a second counting circuit stage to an Nth counting circuit stage perform counting actions according to a second clock signal, where N is a positive integer greater than 2; and
   a first logic operation circuit, coupled to the counting circuit stages and providing the first counting result to be the second clock signal according to an indication signal.

2. The counting device according to claim 1, wherein a frequency of the second clock signal is lower than a frequency of the first clock signal.

3. The counting device according to claim 1, wherein the counting circuit stages form a synchronous counter.

4. The counting device according to claim 1, wherein the first logic operation circuit enables the first counting result to be the second clock signal when the indication signal is at a first logic level, and enables the first clock signal to be the second clock signal when the indication signal is at a second logic level.

5. The counting device according to claim 1, wherein the counting circuit stages respectively receive a plurality of initial values at an initial time point, and set a counting starting point of the counting device according to the initial values.

6. The counting device according to claim 1, further comprising:
   a second logic operation circuit, receiving the first counting result and a second counting result to an Nth counting result respectively generated by the second counting circuit stage to the Nth counting circuit stage, wherein the second logic operation circuit performs a logic operation according to the first counting result to the Nth counting result to generate a counting termination signal.

7. The counting device according to claim 1, wherein the first logic operation circuit comprises:
   a flip flop, receiving the indication signal and generating a synchronization indication signal to synchronize the indication signal according to the first clock signal;
   a first NAND gate, performing a NAND operation on the synchronization indication signal and the first counting result to generate a first signal;
   a delayer, delaying the first signal to generate a second signal;
   an NOR gate, performing an NOR operation on the synchronization indication signal and the first clock signal to generate a third signal; and
   a second NAND gate, performing a NAND operation on the second signal and the third signal to generate the second clock signal.

8. The counting device according to claim 1, wherein the first counting circuit stage comprises:
   an inverter; and
   a flip flop, having a data end coupled to an output end of the inverter, wherein an output end of the flip flop generates the first counting result and is coupled to an input end of the inverter, a clock end of the flip flop receives the first clock signal, the flip flop is activated to performs the counting action according to the indication signal, and an initial signal end of the flip flop receives an initial value.

9. The counting device according to claim 1, wherein each of the second counting circuit stage to the Nth counting circuit stage comprises:
   an XNOR gate, having an input end receiving a current-stage counting result and having another input end receiving a logic operation result generated according to a plurality of previous-stage counting results;
   a flip flop, having a data end coupled to an output end of the XNOR gate, wherein an output end of the flip flop generates the current-stage counting result and is coupled to the input end of the XNOR gate, a clock end of the flip flop receives the second clock signal, the flip flop is activated to performs the counting action according to the indication signal, and an initial signal end of the flip flop receives an initial value; and
   an inverter, coupled to the output end of the flip flop and generating an inverse current-stage counting result according to the current-stage counting result.

10. The counting device according to claim 1, wherein the counting circuit stages performs a decremental counting action according to the indication signal.

* * * * *